(12) United States Patent
Kusuda et al.

(10) Patent No.: US 8,203,357 B2
(45) Date of Patent: Jun. 19, 2012

(54) OPPORTUNISTIC TIMING CONTROL IN MIXED-SIGNAL SYSTEM-ON-CHIP DESIGNS

(75) Inventors: Yoshinori Kusuda, Woburn, MA (US); Michael Coln, Lexington, MA (US); Gary Carreau, Plaistow, NH (US)

(73) Assignee: Analog Devices, Inc., Norwood, MA (US)

( * ) Notice: Subject to any disclaimer, the term of this patent is extended or adjusted under 35 U.S.C. 154(b) by 433 days.

(21) Appl. No.: 12/630,999

(22) Filed: Dec. 4, 2009

(65) Prior Publication Data
US 2011/0043251 A1    Feb. 24, 2011

Related U.S. Application Data

(60) Provisional application No. 61/235,578, filed on Aug. 20, 2009.

(51) Int. Cl.
*H03K 17/16*    (2006.01)
*H03K 19/003*   (2006.01)

(52) U.S. Cl. .................. 326/21; 326/22; 326/26; 326/93
(58) Field of Classification Search .................. None
See application file for complete search history.

(56) References Cited

U.S. PATENT DOCUMENTS 5,563,526 A * 10/1996 Hastings et al. ................ 326/37
7,362,135 B1 * 4/2008 Chang ............................. 326/47

* cited by examiner

*Primary Examiner* — Anh Tran
(74) *Attorney, Agent, or Firm* — Kenyon & Kenyon LLP

(57) ABSTRACT

An integrated circuit may include a plurality of circuit subsystems that include at least one converter circuit operating in respective critical phases and non-critical phases of operation, a clock distribution circuit that has an input for an externally-supplied clock signal that is active during the non-critical phases and inactive during the critical phases, and a clock generator to generate an internal clock signal to the converter circuit that is active when the external-supplied clock signal is inactive.

26 Claims, 8 Drawing Sheets

US 8,203,357 B2

OPPORTUNISTIC TIMING CONTROL IN MIXED-SIGNAL SYSTEM-ON-CHIP DESIGNS

CROSS-REFERENCE TO RELATED APPLICATIONS

This application claims priority from U.S. Provisional Patent Application No. 61/235,578, filed on Aug. 20, 2009, which is incorporated herein in its entirety.

FIELD OF THE INVENTION

The present invention is generally directed to systems and methods that reduce crosstalk and noise coupling in mixed-signal system-on-chip (SOC) circuit designs such as circuit designs that include high precision conversion circuits. In particular, the present invention may reduce crosstalk and noise coupling by opportunistically providing timing signals to the designs.

BACKGROUND INFORMATION

One challenge in mixed-signal System-on-Chip (SOC) designs is how to reduce the adverse effects of crosstalk and/or noise coupling among different circuit blocks. The adverse effects of crosstalk/noise coupling in SOC designs may be worse than those in alternative designs that use discrete circuit blocks. Due to the high level of integration in SOC designs, there may be additional crosstalk/noise coupling through power/signal routing, the common silicon substrate, and packaging. These problems may also be exacerbated by the inputs and outputs of SOC circuits.

FIG. 1 illustrates an example of an integrated circuit 104 having a system-on-chip design (an "SOC IC") that may suffer from cross-talk effects. The SOC IC 104 may include one or more high precision analog-to-digital converter (ADC) 116, interface circuits 108, 122 to interconnect the SOC IC 104 to other integrated circuits and additional processing circuits such as amplifiers 110, correlated differential sampling devices 112, multiplexers 114, interfaces 120 to process and route signals within the SOC IC 104. In the example illustrated in FIG. 1, the SOC IC may accept a large array of input signals IN0-IN255 from a sensor circuit (not shown). A first interface circuit 108 may sample and store the input signals for further processing.

Input amplifiers 110, correlated double sampling (CDS) circuits 112 and multiplexers 114 may route sampled input signals to the ADCs 116 in sequence. The ADCs 116 may convert the routed input signals to digital words, which may be routed further to an output interface 122 via intermediate circuit components (data processor 118 and low-voltage differential signaling (LVDS)/CMOS interface 120) and output from the SOC IC 104.

Electrical activity in the interface circuits and processing circuits 108, 110, 112, 114, 118, 120 and 122 may introduce cross-talk noise into the operation of the ADCs 116. For example, an ADC 116 (say 16 bits of resolution) with a dynamic range of 5 V may need to distinguish between voltage gradations of 76 µV. In large SOC IC designs, however, cross-talk noise may induce voltage fluctuations that cause aberrant performance during ADC conversions. Accordingly, there is a need in the art for managing noise events in integrated circuits to minimize corruption to high precision processing systems.

DETAILED DESCRIPTION

Embodiments of the present invention provide a timing control mechanism to limit signal corruption that might otherwise be introduced into chip sub-systems by crosstalk and noise injected by other sub-systems. According to the present invention, operation of a high precision unit (HPU) is organized into at least two operational phases: a first phase representing critical operation of the HPU, and a second phase representing non-critical operation of the HPU. During the first phase, supply of system clock signals to the integrated circuit may be suspended. The suspension of the system clock may suspend operation of other integrated circuit processing units and, therefore, should eliminate those other units as sources of crosstalk noise to the HPU. During the second phase, supply of the external clock signals to the integrated circuit may be allowed to run freely which causes the other processing units to become operational. Although the other processing units may act as sources of crosstalk noise, the other processing units operate during non-critical phases of operation for the HPU and, therefore, any signal corruption may not materially affect performance of the HPU.

In another embodiment of the present invention, for applications in which sufficient throughput cannot be achieved by suspending the system clock system entirely during the first phase, clock signals may also run during the critical phase but may operate in a gated mode. Although noise sources may operate during the critical phase, they may do so at a low duty phase which should minimize injection of noise to HPUs.

Figure 1:
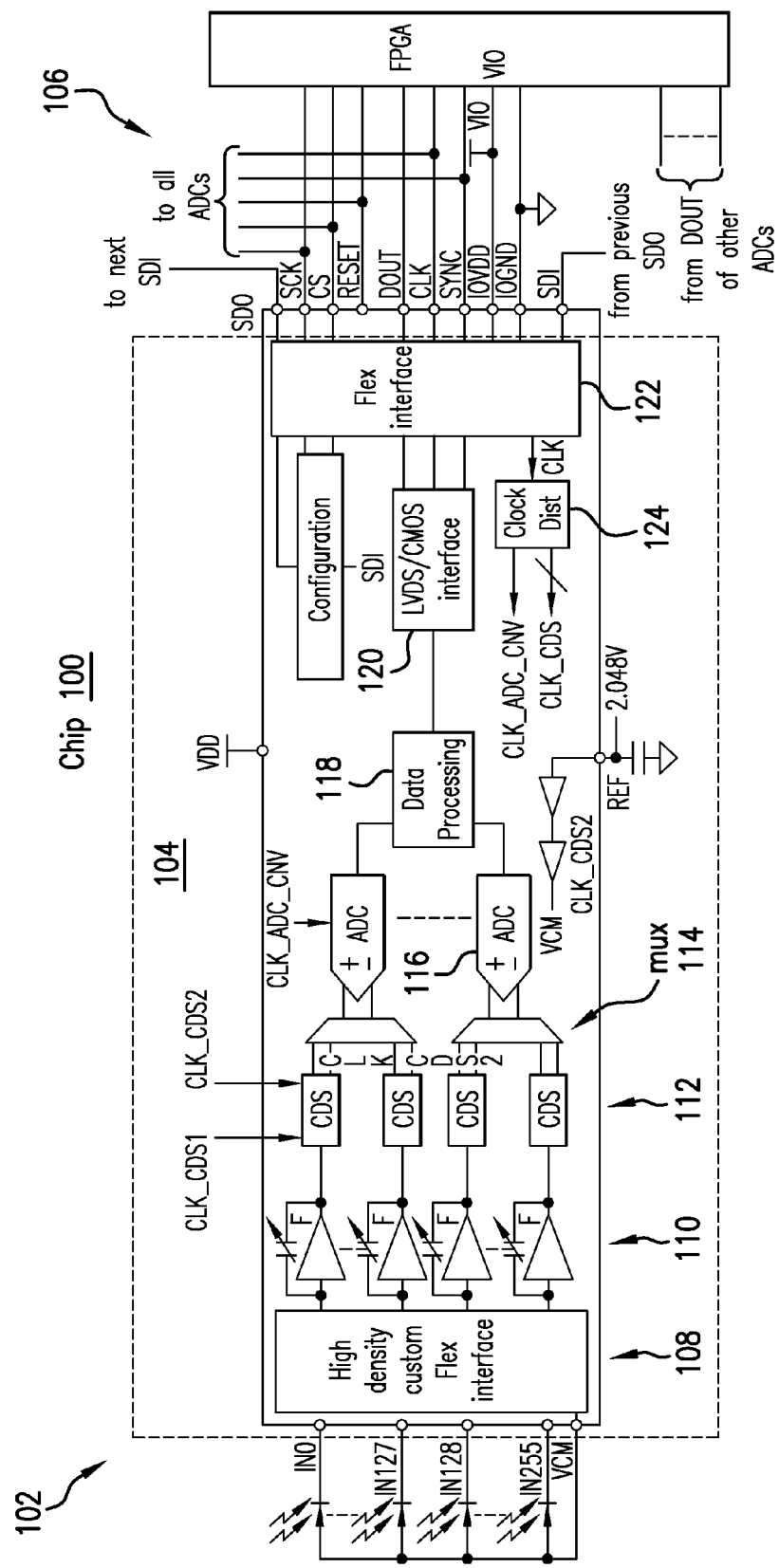
FIG. 1 is a block diagram of a mixed-signal SOC integrated circuit (IC) for analog-to-digital conversion (ADC).
Figure 2:
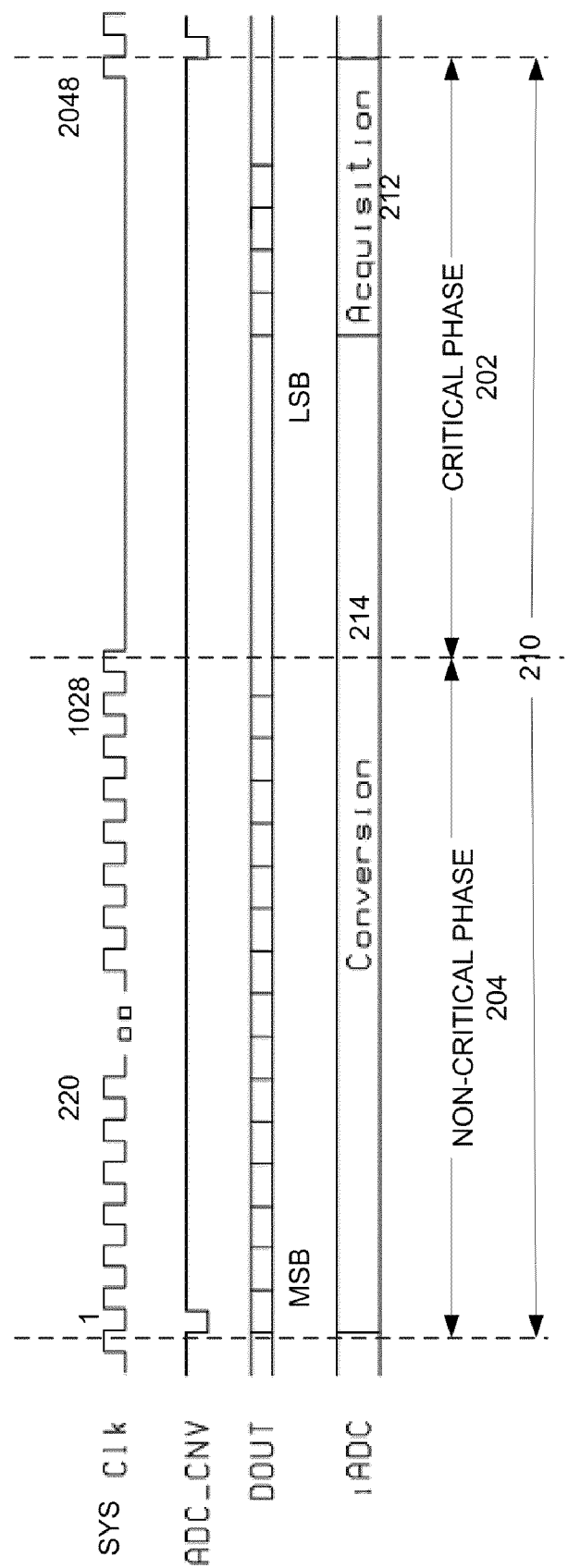
FIG. 2 illustrates application of critical and non-critical phases to an ADC according to an embodiment of the present invention.

FIG. 2 illustrates application of critical and non-critical phases 202, 204 to the operation of an ADC. ADCs typically operate according to an ADC conversion period 210 that includes an acquisition phase 212 and a conversion phase 214. During the acquisition phase 212, a new input signal is sampled by circuits within the ADC. During the conversion phase 214, a digital codeword is generated from the input signal. Thereafter, a subsequent ADC conversion period (not shown) may be performed, with acquisition and conversion of a new input signal. Each ADC cycle 210 may begin with the assertion of a control signal, shown as ADC_CNV in FIG. 2.

According to an embodiment of the present invention, the critical phase 202 of the ADC may be defined to include a conclusion of the conversion phase 214 and an onset of the acquisition phase 212. In many ADC designs, such as SAR ADCs, a conversion phase 214 performs bit trials of an output digital codeword starting with a most significant bit (MSB)

and proceeding across the code until a least significant bit (LSB) is tested and resolved. Bit positions closest to the LSBs of the codeword have the most stringent tolerances for error and are therefore most susceptible to noise corruption. Accordingly, the critical phase 202 may be defined to include bit trials corresponding to these codeword bit positions.

In an embodiment, the critical phase 202 may be defined to include a portion of the ADC acquisition phase 212. As noted, an ADC may sample a new input signal during the acquisition phase 212. After the acquisition phase 212 concludes, sampled charge representing an input signal may be captured within ADC circuits to be tested during a subsequent conversion phase. In an embodiment, the critical phase 202 may be defined to cover the whole acquisition phase 212.

In this embodiment, the remainder of the ADC cycle 210 may be allocated to the non-critical phase. During operation, the externally-supplied system clock signal SYS CLK 220 may be suspended during the critical phase 202 but allowed to run freely during the non-critical phase 204. As discussed, the system clock SYS CLK may drive other processing units within a SOC IC. Because the SYS CLK is suspended during critical phase operations 202, noise contributions to the critical ADC operations should be minimized.

Figure 3:
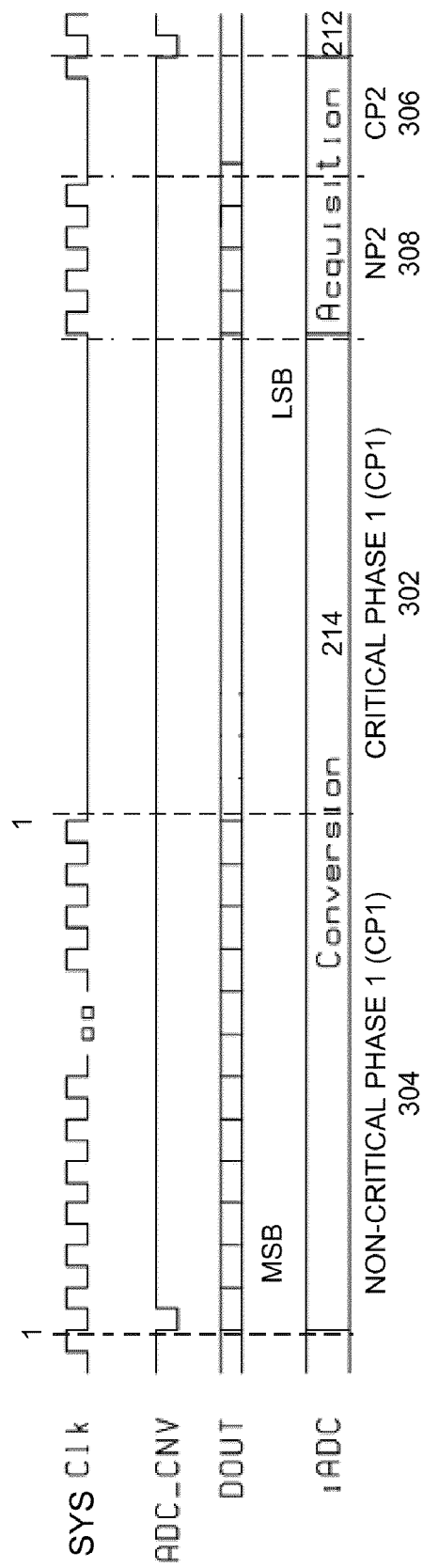
FIG. 3 illustrates application of multiple critical and non-critical phases to an ADC according to an embodiment of the present invention.

In another embodiment, it is permissible to define a plurality of critical phases and non-critical phases during a single ADC conversion period 210. FIG. 3 illustrates application of multiple critical and non-critical phases 302-308 to the operation of an ADC. For example, a first critical phase 302 may extend across a portion of the lower bit trials of the conversion phase 214 and a second critical phase 306 may extend over a terminal portion of the acquisition phase 212. These two critical phases may be interrupted by a second non-critical phase 308 that extends over a beginning portion of the acquisition phase 212 and a first non-critical phase 304 that extends over a remaining portion of the conversion phase 214 that is not covered by the first critical phase.

Figure 4:
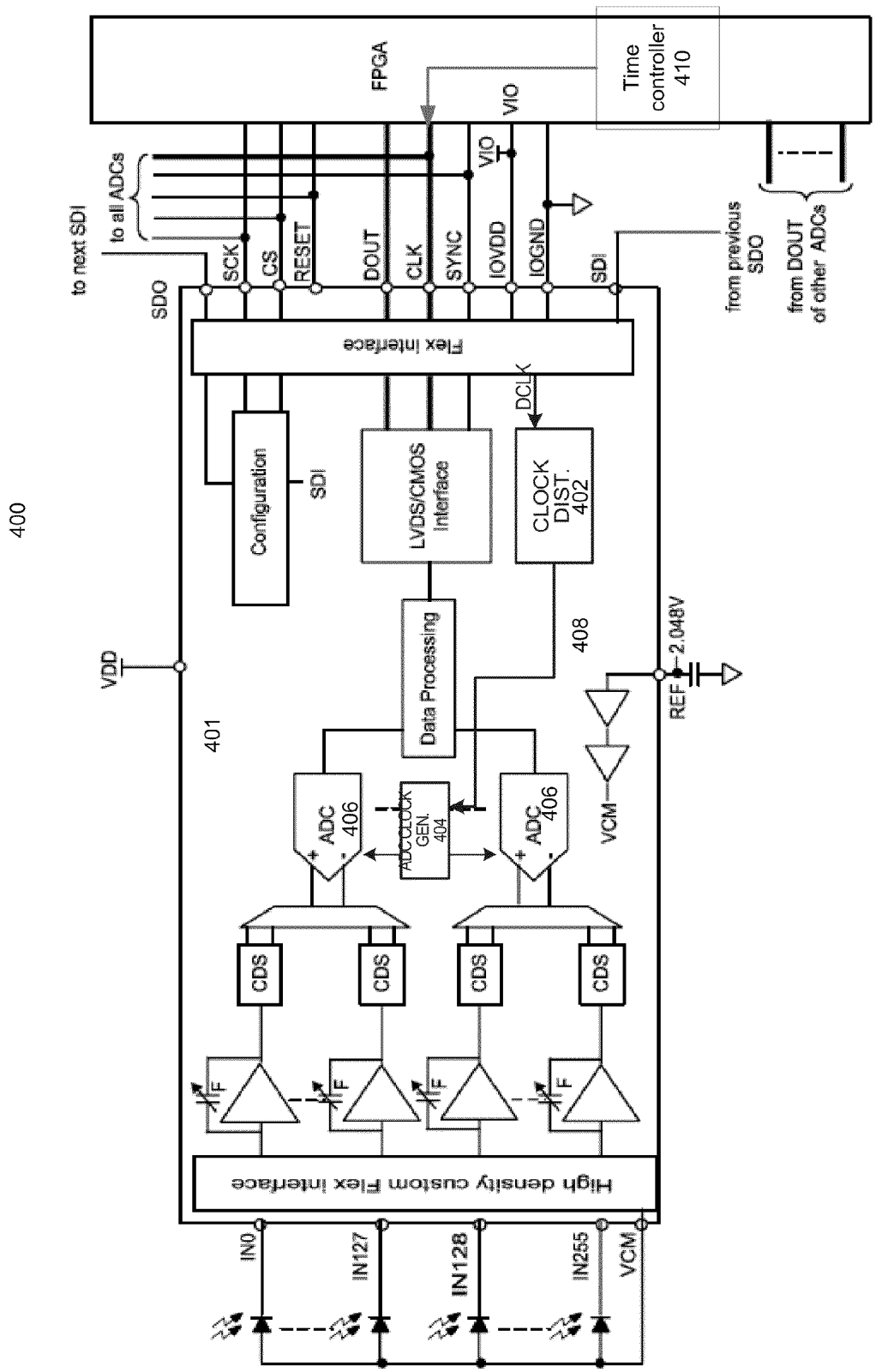
FIG. 4 illustrates an ADC system chip receiving an externally-supplied system clock with opportunistic time control according to an example embodiment of the present invention.

FIG. 4 illustrates an ADC system chip receiving an externally-supplied system clock CLK with opportunistic time control according to an example embodiment of the present invention. Referring to FIG. 4, the ADC system chip 401 may be coupled to analog sensors at input (IN0-255) and to an FPGA at a plurality of pins including a clock input pin for CLK, a digital output pin for DOUT, a reset pin for RESET, and a synchronization pin for SYNC.

In an embodiment, the chip 401 may include ADC converter 406 that may perform high performance ADC. The chip may include other sub-systems, such as external interfaces, LVDS/CMOS interface, and CDSs that represent non-critical sub-systems (or interferers) to the ADC converter. Further, the chip 401 may include a clock distributor 402 coupled to the external interface and an ADC clock generator 404. The clock distributor may receive an externally-supplied CLK through the external interface and provide timing signals to ADCs 406 through the ADC clock generator 404 and provide decimated clock signals to non-critical sub-systems such as CDSs. The operation of the ADC clock generator 404 may be triggered by a trigger signal from the clock distributor. Once the ADC clock generator 404 is triggered, it may automatically generate a local clock signal for the ADCs 406 to operate independently. Therefore, when the system clock CLK is suspended, the ADCs 406 may still continue operating under the local clock signal, or ADC conversion clock ADC_CNV, to convert all bits of the ADCs.

To provide the opportunistic timing as illustrated in FIGS. 2 and 3, a time controller 410 may be implemented by configuring the FPGA that is coupled to the chip 401. The time controller 410 may have a system clock CLK as input and generate a discontinuous system clock DCLK to be supplied to the ADC system. Thus, the time controller may suspend the supply of CLK to the chip 401 during the critical phases (render non-critical sub-systems or interferers inoperative) and resume the supply of CLK to the chip 401 during the non-critical phases (render non-critical sub-systems or interferers operative).

Figure 5:
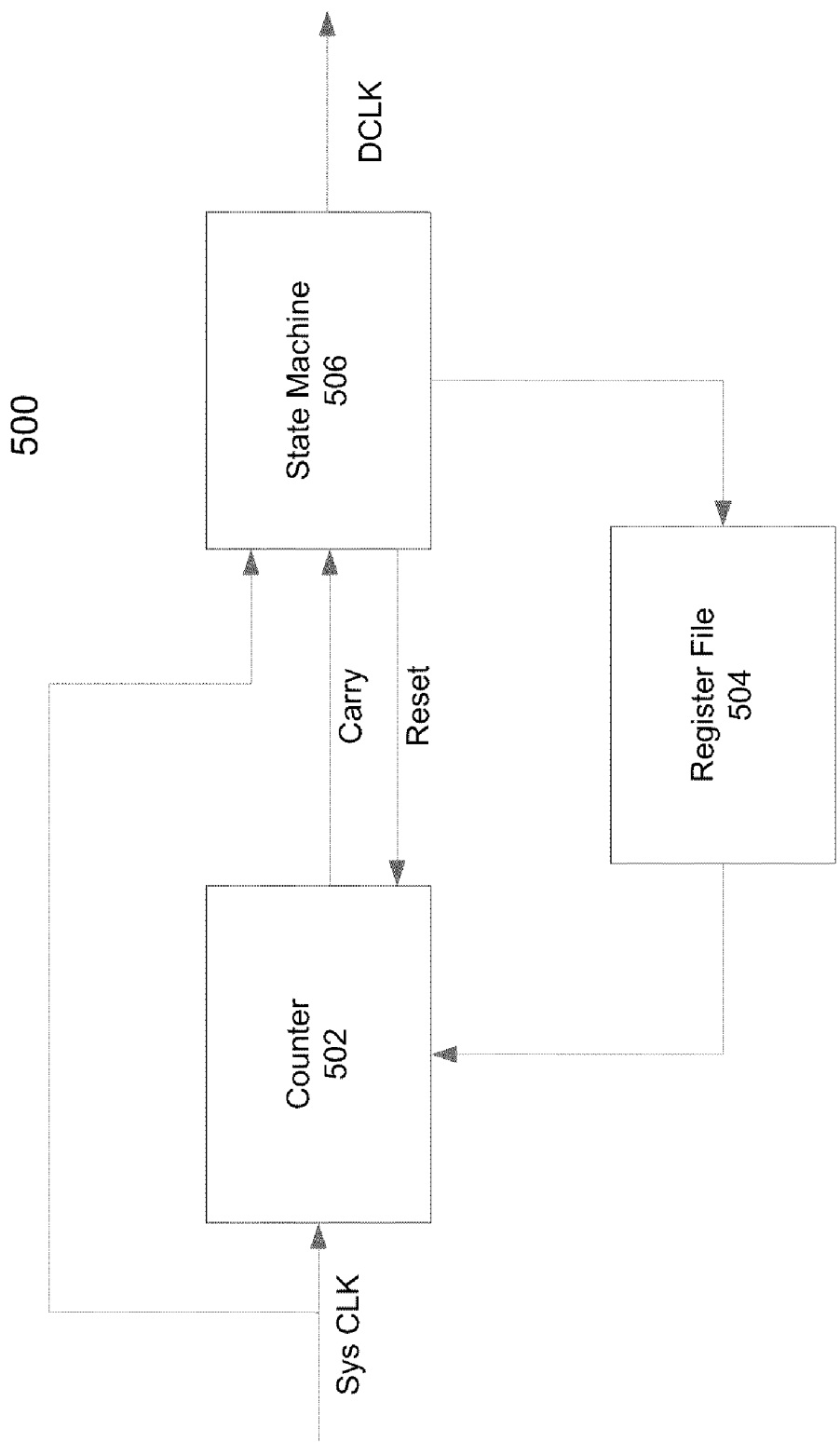
FIG. 5 illustrates a configuration of a time controller according to an embodiment of the present invention.

The time controller may be implemented using a counter 502, a register file 504 and a state machine 504 as shown in FIG. 5. In this embodiment, the counter may count a number of CLK clocks. The register file 504 may be a data file stored in a storage medium such as a memory. The register file 504 may contain data representing the boundaries between critical and non-critical phases. In one embodiment, the boundaries may be stored as numbers of CLK clocks. For example, referring to FIG. 2, the non-critical phase may extend from pulse 1 to 1024, and the critical phase may extend from pulse 1025 to 2048. Then, the register file may contain boundaries at [1, 1024] and [1025, 2048] to represent non-critical and critical phases. For multiple critical and non-critical phases such as FIG. 3, the register file may contain multiple pairs of boundaries to represent the multiple critical and non-critical phases. Thus, the state machine may compare the counter value with the boundaries stored in the register file to determine whether the chip 401 operates in a critical or non-critical phase. The time controller 410 may suspend CLK during critical phases and resume during non-critical phases. In one embodiment, an end of a non-critical phase may be followed immediately by a beginning of a critical phase, and an end of a critical phase may be followed immediately by a beginning of another non-critical phase. Thus, the beginnings and ends of critical phases may be sufficient for determining time boundaries between critical and non-critical phases.

Figure 6:
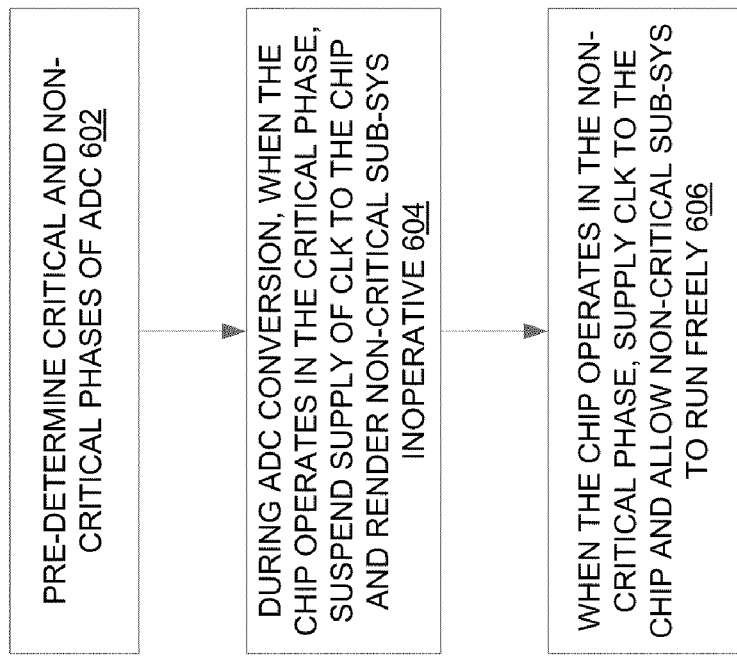
FIG. 6 is a flow chart of a method for opportunistic timing control according to an embodiment of the present invention.

FIG. 6 is a flow chart of a method for opportunistic timing control according to an embodiment of the present invention. With respect to an ADC system, at 602, the beginnings and ends of critical phases and non-critical phases of the ADC operations may be pre-determined based on the characteristics of the ADC system. At 604, during an ADC conversion, the time controller 410 determines that the chip 401 operates during a critical phase, the time controller may suspend the supply of the system clock CLK to the chip 401 and thus render the non-critical sub-systems (or interferers) inoperative during the critical phase. At 606, upon the determination that the chip 401 operates in a non-critical phase, the time controller may supply the system clock CLK to the chip and thus render the non-critical sub-systems operative. Through these steps, the ADCs such as high precision converters may continue to operate under a local clock signal ADC_CNV that is independent of the system clock CLK. Because of the opportunistic supply of CLK, the operation of ADCs may be less affected by the non-critical sub-systems during critical phases.

Figure 7:
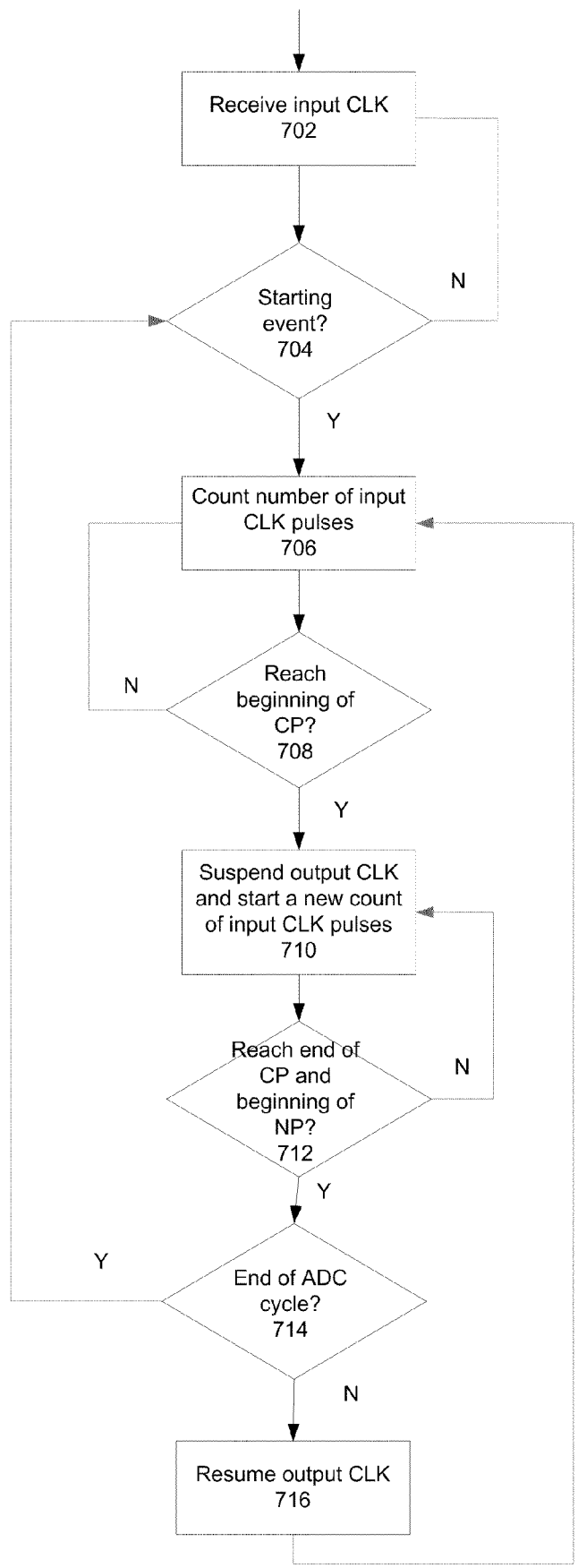
FIG. 7 is a flow chart of a method for opportunistic timing control according to another embodiment of the present invention.

FIG. 7 is a flow chart of a method for opportunistic timing control according to another embodiment of the present invention. At 702, the time controller implemented on the FPGA may receive system clock CLK from a clock source. The time controller also may replicate other timing signals such as CLK_CDS1, CLK_CDS2, RESET, or SYNC as references. At 704, the clock distributor may check whether a starting event for ADC conversion may have occurred. A starting event may be the beginning of CDS2 operation indicated by a falling edge in CLK_CDS2. If there is no starting event, the time controller may continue the state of receiving input CLK. On the other hand, if a starting event is detected, at 706, the time controller may start to count the number of input CLK pulses. Based on the CLK number count, at 808, the clock distributor may make a determination of whether an ADC cycle has reached the beginning of a critical phase. The determination may be made by comparing the count in the counter against a threshold value stored in the register file as shown in FIG. 4. If the beginning of a critical phase has not been reached, the time controller may continue the counting. On the other hand, if the time controller determines that the beginning of a critical phase has been reached, the time controller may suspend the supply of CLK to the chip 401 and renders non-critical sub-systems (or interferers) inoperative at 710. At about the same time of the critical phase beginning, the time controller also may start a new count of CLK for determining an end of the current critical phase. At 712, the time controller may determine whether the end of the current critical phase (or the beginning of next non-critical phase) has been reached. If not, the supply of CLK may be kept suspended. However, if the end of the current critical phase (thus the beginning of a non-critical phase) is detected, at 714, the time controller may determine if the end of the ADC conversion has been reached. If the end of the ADC conversion has been reached, the time controller may go back to step 704 to look for next start event. On the other hand, if the end of the ADC cycle has not been reached, at 716, the clock distributor may resume supplying CLK to the chip 401 and render non-critical sub-systems operative. At about the same time, the time controller may go back to step 706 to start a new number count for input CLK pulses. The new number count is for the next beginning of critical phase.

Figure 8:
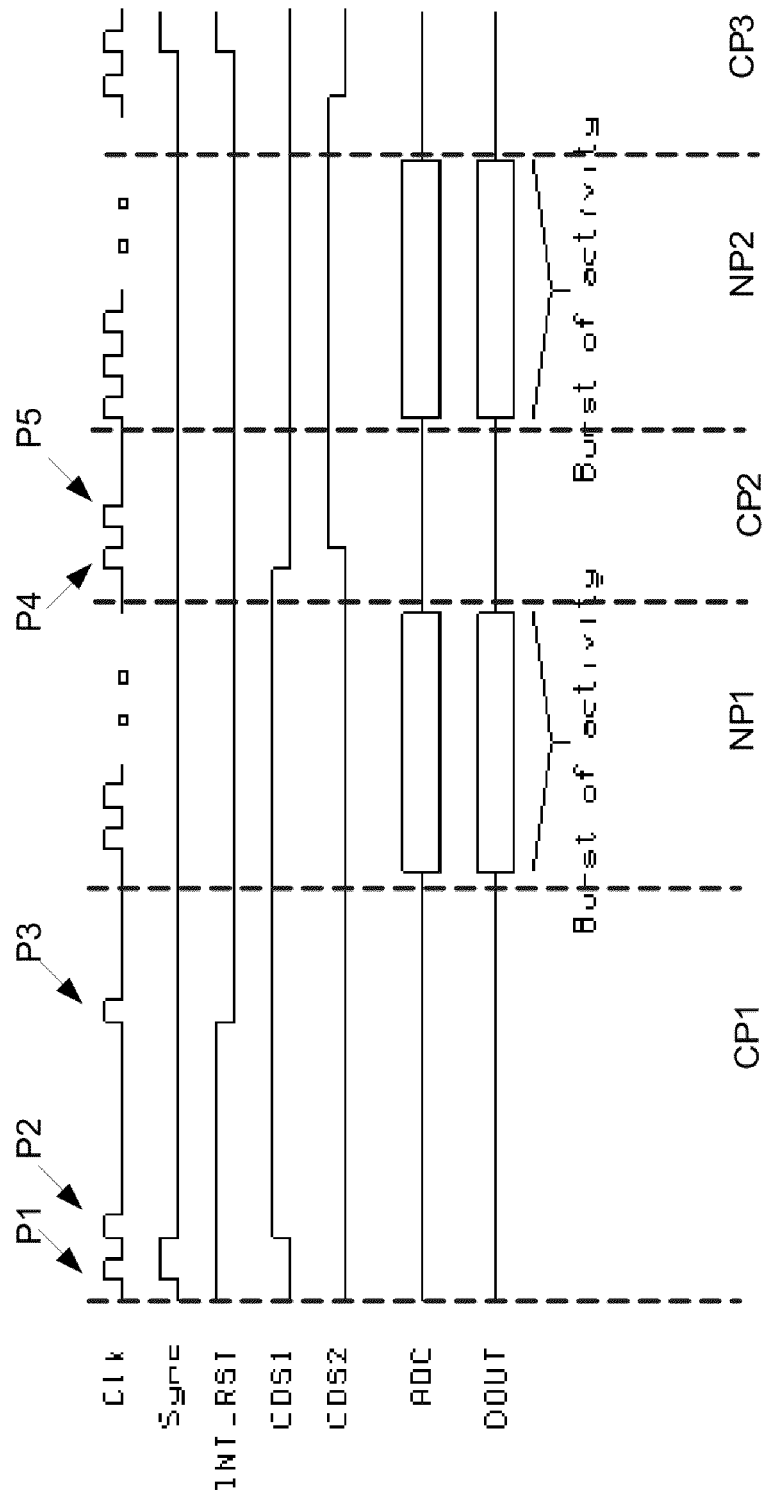
FIG. 8 is a timing diagram illustrating ADC operation in a pipeline mode organized into critical and non-critical phases according to an embodiment of the present invention.

FIG. 8 is a timing diagram illustrating ADC operation in a pipeline mode organized into critical and non-critical phases according to an embodiment of the present invention. FIGS. 2 and 3 show opportunistic timing schemes for serial ADC conversions. Under the serial conversion schemes, the digital output occurs after each ADC conversion. However, under the serial ADC conversion, the throughput of serial ADC conversion may be limited by the speed of ADC. In applications where the analog sensor circuits dominate the throughput of the SOC chip, a pipelined ADC conversion with a timing scheme of bursts of conversion activities may be used. FIG. 8 shows opportunistic timing scheme for such a pipeline ADC conversion.

In this embodiment, the time controller 410 may selectively supply CLK to the clock distributor 402 of the chip 401 during an otherwise CLK-free critical phase. The clock distributor may supply these selected and isolated CLK pulses to the non-critical sub-systems. These isolated CLK pulses may be used to generate internal timing signals for optimal performance of the chip. During the none-critical times, the time controller may supply a burst of system clocks (CLK) to the chip 401 to perform the remaining operations in bursts. Referring to FIG. 8, during the critical phase 1 (CP1), the time controller 410 may generally suspend the supply of CLK to the chip 401 and to non-critical sub-systems. However, at time P1, the time controller may supply a first CLK pulse to allow the generation of a sync signal. At time P2, the time controller may supply a second CLK pulse to allow the generation of the up edge of CLK_CDS1 and a falling edge of the Sync. At time P3, the time controller may supply a third CLK pulse to allow the generation of a falling edge of the internal reset INT_RST. Other than at times of P1, P2, and P3, CP1 may be kept quiet by suspending the supply of CLK. In the ensuing non-critical phase NP1, the internal CLK may be resumed and a burst of ADC operations and DOUT may be performed. After NP1 and during the ensuing critical phase CP2, the supply of CLK may again be suspended in general. However, at time P4, a fourth CLK pulse may be generated to allow the generation a falling edge of CLK_CDS1. At time P5, a fifth CLK pulse may be generated to allow the generation of an up edge of CLK_CDS2. After CP2 and during NP2, the internal CLK may be resumed and another burst of ADC operations and DOUT may occur.

In this embodiment, the critical phases may be those periods when capacitors of ADCs trap charges (such as times at P2, P5) since cross-talk/noise coupling most likely affects the performance of the ADC system. During the non-critical phases, the ADC may run under a separate ADC clock that is independent from the system CLK. Therefore, each burst of activities may accomplish a pre-determined number of conversions. For example, in one embodiment, each burst may accomplish 32 conversions.

FIG. 4 illustrates an embodiment where the time controller is implemented on the FPGA off the chip 401. In some embodiments, a time controller may be implemented as part of the functionality of the clock distributor 402 on the chip 401 rather than externally on the FPGA. In this embodiment, the FPGA may continuously supply CLK to the clock distributor 410 on the chip 401. A controller in the clock distributor may be configured to suspend the supply of CLK to non-critical sub-systems and render the non-critical sub-systems inoperative during critical phases, and to supply CLK to non-critical sub-systems and enable the non-critical sub-systems during non-critical phases. In this way, the precision of ADC bit conversion may be less affected by non-critical system activities. Similarly, the clock distributor also may be configured to supply CLK in bursts as shown in FIG. 8.

The controller in the clock distributor may be configured with a counter, a register file, and a state machine in a manner similar to FIG. 5. The register file may store multiple pre-determined threshold numbers representing boundaries of critical and non-critical phases and to which the state machine may compare the count in the counter. Also, for an embodiment of pipelined ADC as shown in FIG. 8, the register file also may store threshold numbers representing times at which isolated CLK may occur during critical phases. The state machine may allow the supply of these isolated CLK to non-critical sub-systems at these times.

Although the present invention is illustrated by way of ADC converters using mixed-signal SOC designs, the present invention is not limited to ADC converters. The present invention may also be applied to other types of mixed-signal circuits including digital-to-analog converters (DAC).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:
1. An integrated circuit, comprising:
a plurality of circuit sub-systems, at least one of which is a converter circuit operating in respective critical phases and non-critical phases of operation,
a clock distribution circuit, having an input for an externally-supplied clock signal, the external clock signal being active during the non-critical phases and inactive during the critical phases, and
a clock generator to generate an internal clock signal to the converter circuit that is active when the externally-supplied clock signal is inactive.

2. The integrated circuit of claim 1, wherein the converter circuit is an analog-to-digital converter (ADC).

3. The integrated circuit of claim 1, wherein the converter circuit is a digital-to-analog converter (DAC).

4. The integrated circuit of claim 1, wherein the converter circuit is a high precision converter.

5. The integrated circuit of claim 1, wherein the inaction of the externally-supplied clock signal causes the sub-systems other than the converter to be inoperative.

6. The integrated circuit of claim 1, wherein activation of the externally-supplied clock signal causes the sub-systems other than the converter to be operative.

7. A method of managing cross-talk noise in an integrated circuit, having a processing unit, comprising:
during a critical operational phase of the processing unit:
suspending supply of a system clock signal to the integrated circuit, the suspension causing other circuit sub-systems of the integrated circuit to become inactive,
locally driving the processing unit with a local clock signal; and
during a non-critical operational phase of the processing unit, supplying the system clock signal to the integrated circuit, causing the other circuit sub-systems of the integrated circuit to become active.

8. The method of claim 7, wherein the processing unit is an analog-to-digital converter (ACD).

9. The method of claim 7, wherein the processing unit is a digital-to-analog converter (DAC).

10. The method of claim 7, where the processing unit is a high precision processing unit.

11. The method of claim 7, further comprising:
generating the local clock signal at an internal clock generator that is coupled to the processing unit.

12. A clock distributor to selectively supply a system clock signal to a second sub-system based on whether a first sub-system operates in a critical or a non-critical phase, wherein the clock distributor, the first and second sub-systems are on a chip, comprising:
a controller configured to:
receive the system clock signal from an external clock source;
determine if the first sub-system is operating during a critical phase;
when the first sub-system is operating during the critical phase, suspend the supply of the system clock signal to the second sub-system; and
when the first sub-system is not operating during the critical phase, supply the system clock signal to the second sub-system.

13. The clock distributor of claim 12, wherein the first sub-system is operating under a local clock independent of the system clock.

14. The clock distributor of claim 13, wherein a frequency of the system clock is faster than the local clock signal.

15. The clock distributor of claim 12, where the operation of the first sub-system includes at least one critical phase.

16. A converter system, comprising:
a converter;
a sub-system working cooperatively with the converter under a system clock; and
a clock distributor, coupled to the sub-system, for receiving the system clock signal from an external source and for selectively supplying the system clock to the sub-system on the chip,
wherein the clock distributor is configured to:
determine if the converter is operating during a critical phase;
when the converter is operating during the critical phase, suspend the supply of the system clock signal to the sub-system and render the sub-system inoperative; and
when the converter is not operating during the critical phase, supply the system clock signal to the sub-system and render the sub-system operative.

17. The converter system of claim 16, wherein the converter is an analog-to-digital converter.

18. The converter system of claim 17, wherein an analog-to-digital conversion includes a conversion period for converting an analog signal from more significant bits (MSBs) to less significant bits (LSBs) and an acquisition period for capturing the analog signal for the ADC.

19. The converter system of claim 18, wherein the critical phase of the ADC conversion includes a portion of the conversion period and the whole acquisition period.

20. The converter system of claim 18, wherein the critical phase of the ADC conversion includes a portion of the conversion period and a portion of the acquisition period.

21. The converter system of claim 16, wherein the converter is a digital-to-analog converter.

22. A method for selectively supplying a system clock signal to a second sub-system from a clock distributor based on whether a first sub-system operates in a critical or non-critical phase, comprising:
supplying a system clock signal to the clock distributor;
supplying the system clock signal from the clock distributor to the second sub-system;
determining if the first sub-system is operating during a critical phase;
when the first sub-system is operating during the critical phase, suspending the supply of the system clock from the clock distributor to the second sub-system and render the second sub-system inoperative; and
when the first sub-system is not operating during the critical phase, supplying the system clock from the clock distributor to the second sub-system and render the second system operative.

23. A system, comprising:
a chip including a first sub-system and a second sub-system; and
a programmable circuit for selectively supplying a system clock to the second sub-system based on whether a first sub-system operates in a critical or non-critical phase, the programmable circuit programmed to:
determine if the first sub-system is operating during a critical phase;
if the first sub-system is operating during the critical phase, suspend the supply of the system clock signal from the programmable circuit to the second sub-system; and
if the first sub-system is not operating during the critical phase, supply the system clock signal from the programmable circuit to the second sub-system.

24. An integrated circuit, comprising:
a plurality of circuit sub-systems, at least one of which is a converter circuit operating in respective critical phases and non-critical phases of operation,
a clock distribution circuit, having an input for an externally-supplied clock signal, the external clock signal being active during the non-critical phases and inactive during the critical phases except for pre-determined time instances, and a clock generator to generate an internal clock signal to the converter circuit that is active when the externally-supplied clock signal is inactive.

25. The integrated circuit of claim 24, wherein the pre-determined time instances includes whenever a reset signal occurs.

26. The integrated circuit of claim 24, wherein the pre-determined time instances includes whenever a correlated differential sampling clock signal occurs.

* * * * *

UNITED STATES PATENT AND TRADEMARK OFFICE
CERTIFICATE OF CORRECTION

PATENT NO. : 8,203,357 B2
APPLICATION NO. : 12/630999
DATED : June 19, 2012
INVENTOR(S) : Gary Carreau et al.

It is certified that error appears in the above-identified patent and that said Letters Patent is hereby corrected as shown below:

Title page, Item (12), delete "Kusuda" and replace with -- Carreau --.

Title page, Item (75), please correct the order of inventors to read as follows:

Gary Carreau, Michael Coln, Yoshinori Kusuda

Signed and Sealed this
Fourteenth Day of August, 2012

David J. Kappos
*Director of the United States Patent and Trademark Office*